United States Patent
Jamneala et al.

(10) Patent No.: US 7,391,286 B2
(45) Date of Patent: Jun. 24, 2008

(54) IMPEDANCE MATCHING AND PARASITIC CAPACITOR RESONANCE OF FBAR RESONATORS AND COUPLED FILTERS

(75) Inventors: Tiberiu Jamneala, San Francisco, CA (US); Michael Louis Frank, Menlo Park, CA (US); Paul D Bradley, Los Altos, CA (US)

(73) Assignee: Avago Wireless IP Pte Ltd, Singapore (SG)

( * ) Notice: Subject to any disclaimer, the term of this patent is extended or adjusted under 35 U.S.C. 154(b) by 172 days.

(21) Appl. No.: 11/246,939

(22) Filed: Oct. 6, 2005

(65) Prior Publication Data
US 2007/0080759 A1    Apr. 12, 2007

(51) Int. Cl.
H03H 9/54    (2006.01)
(52) U.S. Cl. .......................................... 333/189; 333/25
(58) Field of Classification Search ................. 333/189
See application file for complete search history.

(56) References Cited

U.S. PATENT DOCUMENTS

| | | | |
|---|---|---|---|
| 3,174,122 A | 3/1965 | Fowler et al. | |
| 3,189,851 A | 6/1965 | Fowler | |
| 3,321,648 A | 5/1967 | Kolm | |
| 3,422,371 A | 1/1969 | Poirier et al. | |
| 3,568,108 A | 3/1971 | Poirier et al. | |
| 3,582,839 A | 6/1971 | Pim et al. | |
| 3,590,287 A | 6/1971 | Berlincourt et al. | |
| 3,610,969 A | 10/1971 | Clawson et al. | |
| 3,826,931 A | 7/1974 | Hammond | |
| 3,845,402 A | 10/1974 | Nupp | |
| 4,084,217 A | 4/1978 | Brandis et al. | |
| 4,172,277 A | 10/1979 | Pinson | |
| 4,272,742 A | 6/1981 | Lewis | |
| 4,281,299 A | 7/1981 | Newbold | |
| 4,320,365 A | 3/1982 | Black et al. | |
| 4,355,408 A | 10/1982 | Scarrott | |
| 4,456,850 A | 6/1984 | Inoue et al. | |
| 4,529,904 A | 7/1985 | Hattersley | |
| 4,625,138 A | 11/1986 | Ballato | |

(Continued)

FOREIGN PATENT DOCUMENTS

DE    10160617    6/2003

(Continued)

OTHER PUBLICATIONS

Search Report in the Great Briain Patent Application No. 0619698.4 dated Nov. 30, 2006.

(Continued)

*Primary Examiner*—Barbara Summons

(57) ABSTRACT

A film acoustically-coupled transformer (FACT) has a first and a second stacked bulk acoustic resonator (SBAR 1, SBAR 2). Each SBAR has a stacked pair of film bulk acoustic resonators (FBARs) and an acoustic decoupler between the FBARs. Each FBAR has opposed planar electrodes and a layer of piezoelectric material between the electrodes. A first electrical circuit connecting one of the FBARs of SBAR1 to one of the FBARs of SBAR 2 and a second electrical circuit connecting the other of the FBARs of SBAR 1 to the other of the FBARs of SBAR 2. The first electrical circuit connects the respective FBARs in parallel and second electrical circuit connects the respective FBARs in series. A shunt inductor is included from the reception path to ground.

7 Claims, 2 Drawing Sheets

U.S. PATENT DOCUMENTS

| | | |
|---|---|---|
| 4,719,383 A | 1/1988 | Wang et al. |
| 4,798,990 A | 1/1989 | Henoch |
| 4,836,882 A | 6/1989 | Ballato |
| 4,841,429 A | 6/1989 | Mcclanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,118,982 A | 6/1992 | Inoue et al. |
| 5,129,132 A | 7/1992 | Zdeblick et al. |
| 5,162,691 A | 11/1992 | Mariani et al. |
| 5,241,209 A | 8/1993 | Sasaki |
| 5,241,456 A | 8/1993 | Marcinkiewicz et al. |
| 5,294,898 A | 3/1994 | Dworsky et al. |
| 5,382,930 A * | 1/1995 | Stokes et al. ................ 333/191 |
| 5,384,808 A | 1/1995 | Van Brunt et al. |
| 5,448,014 A | 9/1995 | Kong et al. |
| 5,465,725 A | 11/1995 | Seyed-Boloforosh |
| 5,587,620 A | 12/1996 | Ruby et al. |
| 5,589,858 A | 12/1996 | Kadowaki et al. |
| 5,594,705 A | 1/1997 | Connor et al. |
| 5,671,242 A | 9/1997 | Takiguchi et al. |
| 5,692,279 A | 12/1997 | Mang et al. |
| 5,714,917 A | 2/1998 | Ella |
| 5,853,601 A | 12/1998 | Krishaswamy et al. |
| 5,864,261 A | 1/1999 | Weber |
| 5,872,493 A | 2/1999 | Ella |
| 5,873,153 A | 2/1999 | Ruby et al. |
| 5,873,154 A | 2/1999 | Ylilammi et al. |
| 5,910,756 A | 6/1999 | Ella |
| 5,936,150 A | 8/1999 | Kobrin et al. |
| 5,953,479 A | 9/1999 | Zhou et al. |
| 5,982,297 A | 11/1999 | Welle |
| 6,040,962 A | 3/2000 | Kiyosumi |
| 6,060,818 A | 5/2000 | Ruby et al. |
| 6,087,198 A | 7/2000 | Panasik |
| 6,107,721 A | 8/2000 | Lakin |
| 6,111,480 A | 8/2000 | Iyama et al. |
| 6,124,756 A | 9/2000 | Yaklin et al. |
| 6,150,703 A | 11/2000 | Cushman et al. |
| 6,187,513 B1 | 2/2001 | Toru |
| 6,215,375 B1 | 4/2001 | Larson, III et al. |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,265,246 B1 | 7/2001 | Ruby et al. |
| 6,278,342 B1 | 8/2001 | Ella |
| 6,292,336 B1 | 9/2001 | Cheng |
| 6,307,447 B1 | 10/2001 | Barber et al. |
| 6,307,761 B1 | 10/2001 | Nakagawa |
| 6,376,280 B1 | 4/2002 | Ruby et al. |
| 6,377,137 B1 | 4/2002 | Ruby |
| 6,384,697 B1 | 5/2002 | Ruby |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Akihiko |
| 6,441,539 B1 | 8/2002 | Kitamura et al. |
| 6,462,631 B2 | 10/2002 | Bradley et al. |
| 6,466,105 B1 | 10/2002 | Lobl et al. |
| 6,466,418 B1 | 10/2002 | Cheng |
| 6,469,597 B2 | 10/2002 | Ruby et al. |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Ylilammi et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panaski |
| 6,550,664 B2 | 4/2003 | Bradley et al. |
| 6,564,448 B1 | 5/2003 | Oura et al. |
| 6,566,979 B2 | 5/2003 | Larson et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,600,390 B2 | 7/2003 | Frank |
| 6,601,276 B2 | 8/2003 | Barber |
| 6,617,249 B2 | 9/2003 | Ruby et al. |
| 6,617,750 B2 | 9/2003 | Dummermuth et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 * | 12/2003 | Ella et al. ................... 333/133 |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Hajime |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,928 B2 | 8/2005 | Hedler et al. |
| 6,936,954 B2 | 8/2005 | Peczalski |
| 6,946,928 B2 | 9/2005 | Larson et al. |
| 6,954,121 B2 | 10/2005 | Bradley et al. |
| 6,963,257 B2 | 11/2005 | Ella et al. |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson et al. |
| 6,989,723 B2 | 1/2006 | Komuro et al. |
| 7,019,604 B2 | 3/2006 | Gotoh et al. |
| 7,019,605 B2 | 3/2006 | Larson et al. |
| 7,057,476 B2 | 6/2006 | Hwu |
| 7,084,553 B2 | 8/2006 | Ludwiczak |
| 7,091,649 B2 | 8/2006 | Larson |
| 7,098,758 B2 | 8/2006 | Wang et al. |
| 6,998,940 B2 | 1/2007 | Metzger |
| 7,170,215 B2 | 1/2007 | Namba et al. |

| | | | | | | |
|---|---|---|---|---|---|---|
| 7,173,504 B2 | 2/2007 | Larson | | EP | 1258989 | 1/2004 |
| 7,187,254 B2 | 3/2007 | Su et al. | | EP | 1528674 | 6/2004 |
| 7,230,509 B2 | 6/2007 | Stoemmer | | EP | 1528675 | 6/2004 |
| 2002/0000646 A1 | 1/2002 | Gooch et al. | | EP | 1528677 | 7/2004 |
| 2002/0030424 A1 | 3/2002 | Iwata | | EP | 1249932 | 3/2005 |
| 2002/0121944 A1 | 9/2002 | Larson, III et al. | | EP | 1517443 | 3/2005 |
| 2002/0121945 A1 | 9/2002 | Ruby et al. | | EP | 1517444 | 3/2005 |
| 2002/0152803 A1 | 10/2002 | Larson, III et al. | | EP | 1557945 | 7/2005 |
| 2002/0190814 A1 | 12/2002 | Yamada et al. | | EP | 1575165 | 9/2005 |
| 2003/0001251 A1 | 1/2003 | Cheever et al. | | GB | 1207974 | 11/1967 |
| 2003/0006502 A1 | 1/2003 | Karpman | | GB | 2411239 | 8/2005 |
| 2003/0087469 A1 | 5/2003 | Ma | | GB | 2418791 | 4/2006 |
| 2003/0102776 A1 | 6/2003 | Takeda et al. | | JP | 2002/217676 | 8/2002 |
| 2003/0111439 A1 | 6/2003 | Fetter et al. | | WO | WO-98/16957 | 4/1998 |
| 2003/0128081 A1 | 7/2003 | Ella et al. | | WO | WO-01/06647 | 1/2001 |
| 2003/0132493 A1 | 7/2003 | Kang et al. | | WO | WO-01/99276 | 12/2001 |
| 2003/0141946 A1 | 7/2003 | Ruby et al. | | WO | WO-02/103900 | 12/2002 |
| 2003/0179053 A1 | 9/2003 | Aigner et al. | | WO | WO-03/030358 | 4/2003 |
| 2004/0092234 A1 | 5/2004 | Pohjonen | | WO | WO-03/043188 | 5/2003 |
| 2004/0124952 A1 | 7/2004 | Tikka | | WO | WO-03/050950 | 6/2003 |
| 2004/0150293 A1* | 8/2004 | Unterberger ............... 310/322 | | WO | WO 03/058809 | 7/2003 |
| 2004/0150296 A1 | 8/2004 | Park et al. | | WO | WO-2004/034579 | 4/2004 |
| 2004/0195937 A1 | 10/2004 | Matsubara et al. | | WO | WO-2004/051744 | 6/2004 |
| 2004/0257172 A1 | 12/2004 | Schmidhammer et al. | | WO | WO 2005/043752 | 5/2005 |
| 2004/0263287 A1 | 12/2004 | Ginsburg et al. | | WO | WO 2005/043753 | 5/2005 |
| 2005/0012570 A1 | 1/2005 | Korden et al. | | WO | WO-2005/043756 | 5/2005 |
| 2005/0023931 A1 | 2/2005 | Bouche et al. | | | | |
| 2005/0030126 A1 | 2/2005 | Inoue et al. | | | | |
| 2005/0036604 A1 | 2/2005 | Scott et al. | | | | |
| 2005/0057117 A1 | 3/2005 | Nakatsuka et al. | | | | |
| 2005/0057324 A1 | 3/2005 | Onishi et al. | | | | |
| 2005/0068124 A1 | 3/2005 | Stoemmer | | | | |
| 2005/0093396 A1 | 5/2005 | Larson et al. | | | | |
| 2005/0093653 A1 | 5/2005 | Larson, III | | | | |
| 2005/0093654 A1 | 5/2005 | Larson et al. | | | | |
| 2005/0093655 A1 | 5/2005 | Larson et al. | | | | |
| 2005/0093657 A1 | 5/2005 | Larson et al. | | | | |
| 2005/0093658 A1* | 5/2005 | Larson et al. ............... 333/191 | | | | |
| 2005/0093659 A1* | 5/2005 | Larson et al. ............... 333/191 | | | | |
| 2005/0104690 A1 | 5/2005 | Larson | | | | |
| 2005/0110598 A1 | 5/2005 | Larson, III | | | | |
| 2005/0128030 A1 | 6/2005 | Larson et al. | | | | |
| 2005/0140466 A1 | 6/2005 | Larson, III et al. | | | | |
| 2005/0167795 A1 | 8/2005 | Higashi | | | | |
| 2005/0193507 A1 | 9/2005 | Ludwiczak | | | | |
| 2005/0206271 A1 | 9/2005 | Higuchi et al. | | | | |
| 2005/0218488 A1 | 10/2005 | Mie | | | | |
| 2006/0087199 A1 | 4/2006 | Larson et al. | | | | |
| 2006/0103492 A1 | 5/2006 | Feng et al. | | | | |
| 2006/0132262 A1 | 6/2006 | Fazzlo et al. | | | | |
| 2006/0164183 A1 | 7/2006 | Tikka | | | | |
| 2006/0185139 A1 | 8/2006 | Larson, III et al. | | | | |
| 2007/0084964 A1 | 4/2007 | John et al. | | | | |
| 2007/0085447 A1 | 4/2007 | Larson | | | | |
| 2007/0085631 A1 | 4/2007 | Larson et al. | | | | |
| 2007/0085632 A1 | 4/2007 | Larson et al. | | | | |
| 2007/0086080 A1 | 4/2007 | Larson et al. | | | | |
| 2007/0086274 A1 | 4/2007 | Nishimura et al. | | | | |
| 2007/0090892 A1 | 4/2007 | Larson | | | | |
| 2007/0170815 A1 | 7/2007 | Unkrich | | | | |
| 2007/0171002 A1 | 7/2007 | Unkrich | | | | |

FOREIGN PATENT DOCUMENTS

| | | |
|---|---|---|
| EP | 0865157 | 9/1998 |
| EP | 0880227 | 11/1998 |
| EP | 0973256 | 1/2000 |
| EP | 1047189 | 10/2000 |
| EP | 1100196 | 11/2000 |
| EP | 1096259 | 5/2001 |
| EP | 1258990 | 11/2002 |
| EP | 1180494 | 3/2003 |
| EP | 1542362 | 6/2003 |

OTHER PUBLICATIONS

U.S. Appl. No. 10/971,169, filed Oct. 22, 2004, Larson, III., John D., et al.

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

Navas, J. et al., "Miniaturised Battery Charger using Piezoelectric Transformers", *IEEE*, (2001),492-496.

Jiang, Yimin et al., "A Novel Single-Phase Power Factor Correction Scheme", *IEEE*, (1993),287-292.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

Lobl, H.P. et al., "Piezoelectric Materials For BAW Resonators And Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exhibition*, (Jan. 2, 2002),8-14.

Jung, Jun-Phil et al., "Experimental And Theoretical Investigation On The Relationship Between AIN Properties And AIN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AIN Film Using MOCVD For 5GHx Band FBAR Filter", *2003 IEEE Ultrasonics Symposium*, (Oct. 5, 2003),pp. 170-173.

Martin, Steven J., et al., "Development Of A Low Dielectric Constant Polymer For The Fabrication Of Integrated Circuit Interconnect", *12 Advanced Materials*, (Dec. 23, 2000),1769-1778.

Hadimioglu, B. et al., ""Polymer Films As Acoustic Matching Layers".", *1990 IEEE Ultrasonics Symposium Proceedings*, vol. 3 pp., [Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007,(Dec. 1990),1337-1340.

"Search Report from corresponding application No.", GB 0605779. 8, (Aug. 23, 2006).

"Examination Report from UK for application", GB 0605971.1, (Aug. 24, 2006).

"Examination report corresponding to application No.", GB0605770.7, (Aug. 25, 2006).

"Examination Report corresponding to application No.", GB0605775.6, (Aug. 30, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23, 2006).

Coombs, Clyde F., et al., "Electronic Instrument Handbook", *Second Edition, McGraw-Hill, Inc.*, (1995),pp. 5.1 to 5.29.

"A partial GB Search Report for", Application No. GB0522393.8, (Jan. 9, 2006),4 pages.

"A partial GB Search Report for Application No.", GB0525884.3, (Feb. 2, 2006),4 pgs.

Auld, B. A., "Acoustic Resonators", *Acoustic Fields and Waves in Solids, Second Edition*, vol. II, (1990),250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys.* *54* (10), (Oct. 1983),5893-5910.

"Search Report from corresponding application", No. GB0605225.2.

"Search Report for Great Britain Patent Application", No. 0617742. 2, (Mar. 29, 2007).

"Search Report for Great Britain Patent Application", No. 0617742. 2, (Dec. 13, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", 0-7803-8331-1/4/W20.00; *IEEE MTT-S Digest*, (2004),927-929.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

\* cited by examiner

IMPEDANCE MATCHING AND PARASITIC CAPACITOR RESONANCE OF FBAR RESONATORS AND COUPLED FILTERS

BACKGROUND

Transformers are used in many types of electronic device to perform such functions as transforming impedances, linking single-ended circuitry with balanced circuitry or vice versa and providing electrical isolation. However, not all transformers have all of these properties. For example, an autotransformer does not provide electrical isolation.

Transformers operating at audio and radio frequencies up to VHF are commonly built as coupled primary and secondary windings around a high permeability core. Current in the windings generates a magnetic flux. The core contains the magnetic flux and increases the coupling between the windings. A transformer operable in this frequency range can also be realized using an optical-coupler. An opto-coupler used in this mode is referred to in the art as an opto-isolator.

In transformers based on coupled windings or opto-couplers, the input electrical signal is converted to a different form of energy (i.e., a magnetic flux or photons) that interacts with an appropriate transforming structure (i.e., another winding or a light detector), and is re-constituted as an electrical signal at the output. For example, an opto-coupler converts an input electrical signal to photons using a light-emitting diode. The photons pass through an optical fiber or free space that provides isolation. A photodiode illuminated by the photons generates an output electrical signal from the photon stream. The output electrical signal is a replica of the input electrical signal.

At UHF and microwave frequencies, coil-based transformers become impractical due to such factors as losses in the core, losses in the windings, capacitance between the windings, and a difficulty to make them small enough to prevent wavelength-related problems. Transformers for such frequencies are based on quarter-wavelength transmission lines, e.g., Marchand type, series input/parallel output connected lines, etc. Transformers also exist that are based on micromachined coupled coils sets and are small enough that wavelength effects are unimportant. However such transformers have issues with high insertion loss. In addition, coil-based transformers have very wide passbands which does not allow for significant filtering function.

All the transformers just described for use at UHF and microwave frequencies have dimensions that make them less desirable for use in modem miniature, high-density applications such as cellular telephones. Such transformers also tend to be high in cost because they are not capable of being manufactured by a batch process and because they are essentially an off-chip solution. Moreover, although such transformers typically have a bandwidth that is acceptable for use in cellular telephones, they typically have an insertion loss greater than 1 dB, which is too high.

Opto-couplers are not used at UHF and microwave frequencies due to the junction capacitance of the input LED, non-linearities inherent in the photodetector, limited power handling capability and insufficient isolation to give good common mode rejection.

A film acoustically-coupled transformer (FACT) shown in FIG. 1. A FACT transformer has a first and a second stacked bulk acoustic resonator (SBAR 1, SBAR 2). Each SBAR has a stacked pair of film bulk acoustic resonators (FBARs) and an acoustic decoupler between the FBARs. Each of the FBARs has opposed planar electrodes and a layer of piezoelectric material between the electrodes. A first electrical circuit connecting one of the FBARs of SBAR1 to one of the FBARs of SBAR2 and a second electrical circuit connecting the other of the FBARs of SBAR 1 to the other of the FBARs of SBAR 2. The first electrical circuit connects the respective FBARs in parallel and second electrical circuit connects the respective FBARs in series. This embodiment has a nominal 1:1 impedance transformation ratio between the first and second electrical circuits. In the first stack, the parasitic capacitance across the acoustic decoupler can be high thus lowering the insertion loss and affecting the differential performance adversely.

A film acoustically-coupled transformer (FACT) shown in FIG. 2. A FACT transformer has a first and a second stacked bulk acoustic resonator (SBAR 1, SBAR 2). Each SBAR has a stacked pair of film bulk acoustic resonators (FBARs) and an acoustic decoupler between the FBARs. Each of the FBARs has opposed planar electrodes and a layer of piezoelectric material between the electrodes. A first electrical circuit connecting one of the FBARs of SBAR1 to one of the FBARs of SBAR2 and a second electrical circuit connecting the other of the FBARs of SBAR 1 to the other of the FBARs of SBAR 2. The first electrical circuit connects the respective FBARs in anti-parallel and second electrical circuit connects the respective FBARs in series. This embodiment has a 1:4 impedance transformation between the first and the second electrical circuits. Similar to FIG. 1, the first stack has a high parasitic capacitance across the acoustic decoupler that adversely affects performance. In addition, the required crossover in connectivity introduces series, shunt parasitic resistance and capacitance.

SUMMARY

In an embodiment, a film acoustically-coupled transformer (FACT) has a first and a second stacked bulk acoustic resonator (SBAR 1, SBAR 2). Each SBAR has a stacked pair of film bulk acoustic resonators (FBARs) and an acoustic decoupler between the FBARs. Each of the FBARs has opposed planar electrodes and a layer of piezoelectric material between the electrodes. A first electrical circuit connecting one of the FBARs of SBAR1 to one of the FBARs of SBAR 2 and a second electrical circuit connecting the other of the FBARs of SBAR 1 to the other of the FBARs of SBAR 2. The first electrical circuit connects the respective FBARs in parallel and second electrical circuit connects the respective FBARs in series. A shunt inductor is included from the reception path to ground.

DETAILED DESCRIPTION

Each of the disclosed embodiments includes shunt inductance in the reception path. The shunt inductance fulfills three distinct functions simultaneously which are impedance matching, parasitic capacitance resonance and electrostatic device (ESD) protection. The first two functions, impedance matching and parasitic capacitance resonance, if realized separately, by two different inductors, would require much larger inductors with additional insertion loss and area. The parallel combination of these two inductors allows for our shunt inductor to be significantly smaller. The reduced size of the shunt inductor greatly improves its effect as an ESD protector.

Figure 1:
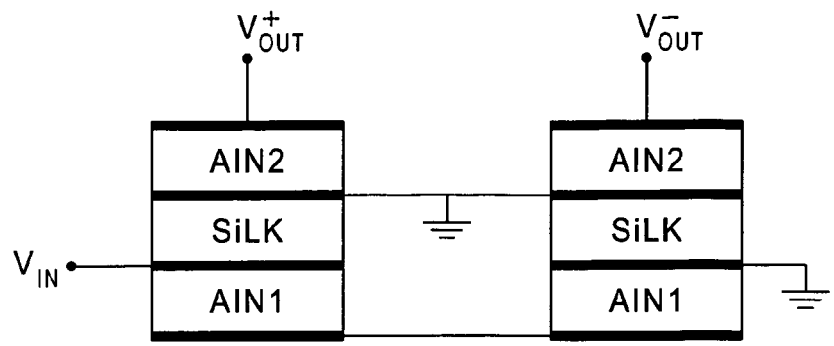
FIG. 1 illustrates a prior art solution.
Figure 2:
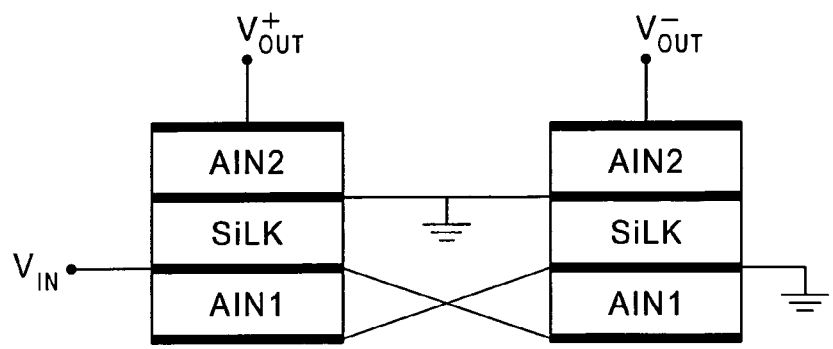
FIG. 2 illustrates a prior art solution.
Figure 3:
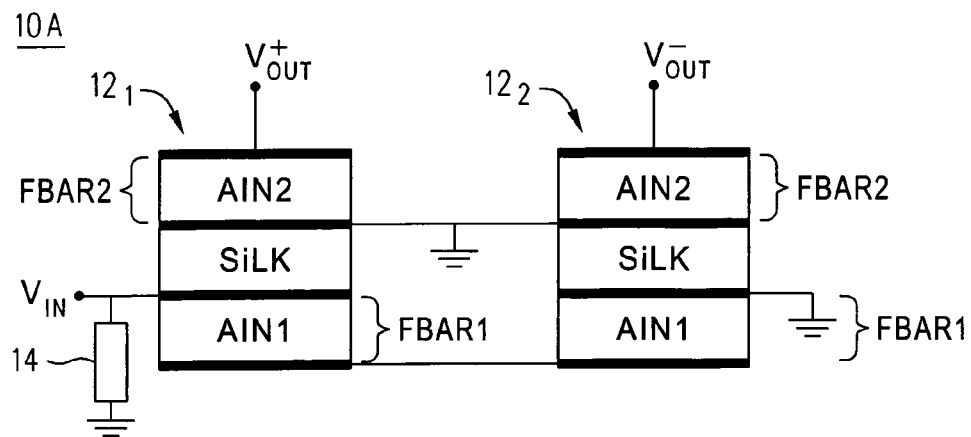
FIG. 3 illustrates an embodiment of the present invention.

FIG. 3 illustrates an embodiment of the present invention 10A. A film acoustically-coupled transformer (FACT) has a first and a second stacked bulk acoustic resonator (SBAR 1, SBAR 2) $12_1$, $12_2$. Each SBAR $12_1$, $12_2$ has a stacked pair of film bulk acoustic resonators (FBAR 1. FBAR2) and an acoustic decoupler between the FBARs. Each of the FBARs has opposed planar electrodes and a layer of piezoelectric material between the electrodes. A first electrical circuit connecting one of the FBARs of SBAR1 $12_1$ to one of the FBARs of SBAR 2 $12_2$ and a second electrical circuit connecting the other of the FBARs of SBAR 1 $12_1$ to the other of the FBARs of SBAR 2 $12_2$. The first electrical circuit connects the respective FBARs in parallel and second electrical circuit connects the respective FBARs in series. A shunt inductor 14 is included from $V_{in}$ to ground.

This embodiment has a nominal 1:1 impedance transformation ratio between the first and second electrical circuits, but the shunt inductor allows for a controlled change in this transformation ratio by lowering the total impedance of the electrical circuit at which it is placed.

Figure 4:
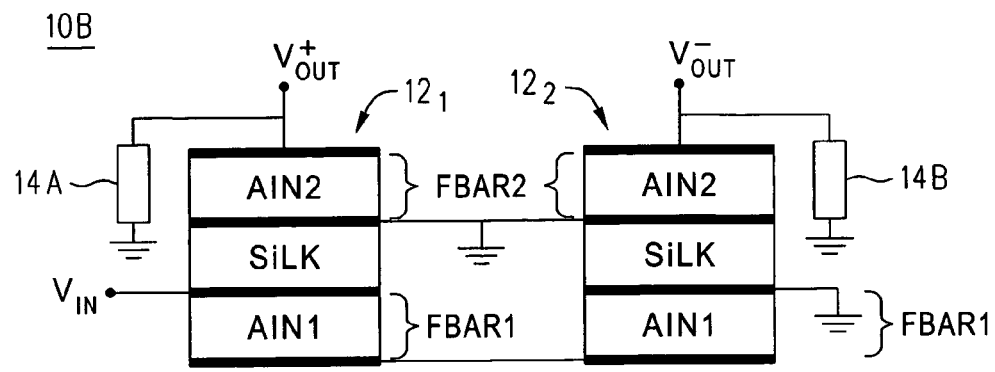
FIG. 4 illustrates an embodiment of the present invention.

FIG. 4 illustrates an embodiment of the present invention. The SBARs $12_1$, $12_2$ are connected as shown in FIG. 3. A first shunt inductor 14A is included from $V_{out}^+$ to ground. A second shunt inductor 14B is included from $V_{out}^-$ to ground.

Figure 5:
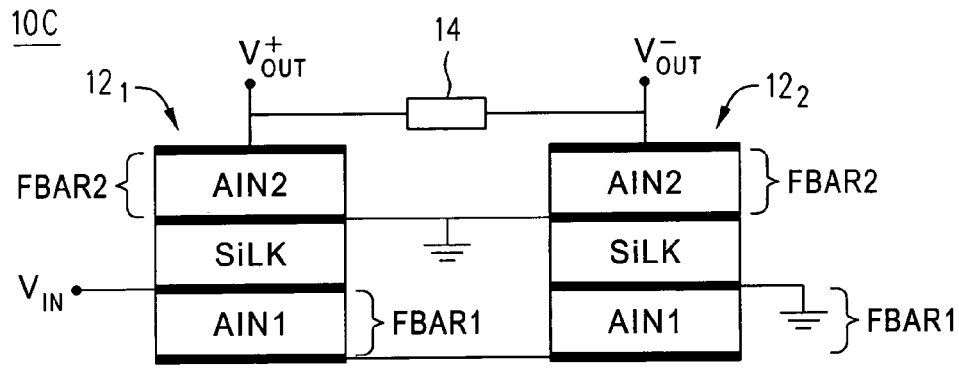
FIG. 5 illustrates an embodiment of the present invention.

FIG. 5 illustrates an embodiment of the present invention. The SBARs $12_1$, $12_2$ are connected as shown in FIG. 3. A shunt inductor 14 is included from the $V_{out}^+$ to $V_{out}^-$.

Figure 6:
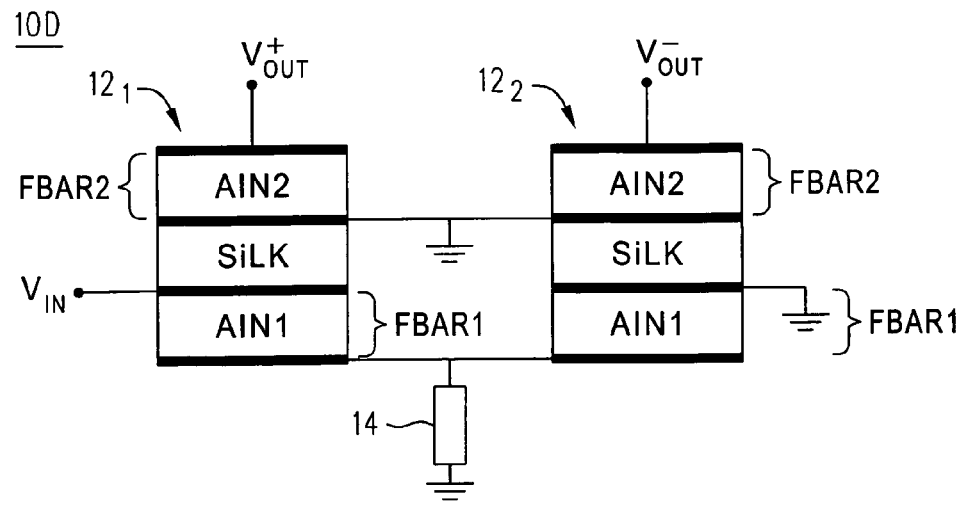
FIG. 6 illustrates an embodiment of the present invention.

FIG. 6 illustrates an embodiment of the present invention. The SBARs $12_1$, $12_2$ are connected as shown in FIG. 3. A shunt inductor 14 connects from the serially connected FBARs to ground.

The invention claimed is:

1. A transformer comprising:
    a first and a second stacked bulk acoustic resonator (SBAR), each SBAR including, a first and a second film bulk acoustic resonator (FBAR), each FBAR including a pair of opposed planar electrodes and a layer of piezoelectric material, an acoustic decoupler interposing the first and second FBARs, a first electrical circuit connecting first FBAR of the first SBAR to the second FBAR of the second SBAR, the first electrical circuit connecting the first FBAR of the first SBAR to the second FBAR of the second SBAR in parallel; a second electrical circuit connecting the second FBAR of the first SBAR to the first FBAR of the second SBAR, the second electrical circuit connecting the second FBAR of the first SBAR to the first FBAR of the second SBAR in series; and a first shunt inductor electrically connected to the first SBAR.

2. A transformer, as defined in claim 1, the first shunt inductor interposing an input and ground.

3. A transformer, as defined in claim 1, wherein: a second shunt inductor interposes a positive differential output to ground; and wherein the first shunt inductor interposes a negative differential output to ground.

4. A transformer, as defined in claim 1, the first shunt inductor connecting between a positive and a negative differential outputs.

5. A transformer, as defined in claim 1, the first shunt inductor interposing the second electrical circuit and ground.

6. A transformer comprising:
    a first and a second stacked bulk acoustic resonator (SBAR), each SBAR including, a first and a second film bulk acoustic resonator (FBAR), each FBAR including a pair of opposed planar electrodes and a layer of piezoelectric material, an acoustic decoupler interposing the first and second FBARs, a first electrical circuit connecting first FBAR of the first SBAR to the second FBAR of the second SBAR; a second electrical circuit connecting the second FBAR of the first SBAR to the first FBAR of the second SBAR; and a first shunt inductor electrically connected to the first SBAR; and
    a second shunt inductor interposing a positive differential output to ground; and wherein the first shunt inductor interposes a negative differential output to ground.

7. A transformer comprising:
    a first and a second stacked bulk acoustic resonator (SBAR), each SBAR including, a first and a second film bulk acoustic resonator (FBAR), each FBAR including a pair of opposed planar electrodes and a layer of piezoelectric material, an acoustic decoupler interposing the first and second FBARs, a first electrical circuit connecting first FBAR of the first SBAR to the second FBAR of the second SBAR;
    a second electrical circuit connecting the second FBAR of the first SBAR to the first FBAR of the second SBAR; and
    a first shunt inductor electrically connected to the first SBAR and between a positive differential output and a negative differential output.

* * * * *